United States Patent
Shang et al.

(10) Patent No.: US 11,297,728 B1
(45) Date of Patent: Apr. 5, 2022

(54) CARRIER SUPPORTING NESTED, REPLACEABLE HARDWARE COMPONENTS

(71) Applicant: Dell Products, L.P., Round Rock, TX (US)

(72) Inventors: Zhao Wei Shang, Shanghai (CN); Aiqin Liu, Shanghai (CN); Qingqiang Guo, Shanghai (CN); Zhao Chen, Shanghai (CN)

(73) Assignee: Dell Products, L.P., Round Rock, TX (US)

( * ) Notice: Subject to any disclaimer, the term of this patent is extended or adjusted under 35 U.S.C. 154(b) by 8 days.

(21) Appl. No.: 17/068,002

(22) Filed: Oct. 12, 2020

(30) Foreign Application Priority Data

Sep. 23, 2020 (CN) .......................... 202011011481.8

(51) Int. Cl.
*H05K 7/14* (2006.01)
(52) U.S. Cl.
CPC ................. *H05K 7/1488* (2013.01)
(58) Field of Classification Search
None
See application file for complete search history.

(56) References Cited

U.S. PATENT DOCUMENTS

| | | | | |
|---|---|---|---|---|
| 4,821,146 A | * | 4/1989 | Behrens ............... | H05K 7/1461 174/383 |
| 5,340,340 A | * | 8/1994 | Hastings ................. | G06F 1/181 312/223.1 |
| 5,342,123 A | * | 8/1994 | Cole ................... | G11B 33/005 292/229 |
| 2010/0087956 A1 | * | 4/2010 | Regimbal ............ | H05K 7/2019 700/276 |
| 2012/0248952 A1 | * | 10/2012 | Gong ................... | H05K 7/1494 312/244 |

\* cited by examiner

*Primary Examiner* — James Wu
*Assistant Examiner* — Christopher L Augustin
(74) *Attorney, Agent, or Firm* — Fogarty LLP

(57) ABSTRACT

A chassis housing one or more Information Handling Systems (IHSs) includes a bay for coupling hardware components to the chassis, such as rear-facing bay that extends from the chassis midplane to an externally accessible opening. A first hardware component is fastened to a removeable carrier and the carrier is inserted in the bay, with the first hardware component coupling to the midplane. The carrier includes arms that extend to the externally accessible opening. Each arm includes a retractable handle that is used, when in an extended position, to extract the carrier from the bay. A second, removeable hardware component is inserted in the bay, with the second hardware components nested between the arms of the carrier. The carrier handles rotate to a concealed position when the second hardware component is nested in the carrier and the handles rotate to the extended position when the second hardware component is removed.

20 Claims, 8 Drawing Sheets

CARRIER SUPPORTING NESTED, REPLACEABLE HARDWARE COMPONENTS

FIELD

This disclosure relates generally to Information Handling Systems (IHSs), and more specifically, to replaceable hardware components utilized by IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as servers, that are installed within chassis and stacked within slots provided by racks. A data center may include large numbers of such racks that may be organized into rows in a manner that allows administrators to access components of the IHSs via the front and back of a rack. In some instances, administrators may be able to service and replace components of a rack-mounted IHS while the IHS remains operational and installed within the rack. Such replaceable components may be referred to as being hot-pluggable. An administrator may also be able to re-configure aspects of the operation of a rack-mounted IHS through the coupling and de-coupling of cables to the various connectors that may be provided on the back of a chassis or by a rear-facing chassis component. In some instances, administrators may remove an IHS from operation in order to service or replace some of its internal components. In all such cases, it is preferable that administrators be able to access and service an IHS as easily and safely as possible within the constraints of a server IHS being installed within a rack of a densely packed data center.

SUMMARY

In various embodiments, a chassis houses one or more Information Handling Systems (IHSs). The chassis includes: a midplane comprising a plurality of connectors; a first bay for coupling hardware components to the chassis, wherein the first bay extends from the midplane at a distal end to a proximal end that is externally accessible; a removeable carrier inserted in the distal end of the first bay, wherein a first hardware component is fastened to the carrier and interfaces with one or more of the midplane connectors, and wherein the carrier comprises arms that extend to the proximal end of the first bay, and wherein each arm comprises a retractable handle for use in extracting the removeable carrier from the first bay when the retractable handles are in an extended position; and a second, removeable hardware component inserted in the proximal end of the first bay, wherein the second hardware components is inserted between the arms of the carrier, and wherein the handles rotate to a concealed position when the second hardware component is inserted in between the arms of the carrier and wherein the handles rotate to the extended position when the second hardware component is not inserted in between the arms of the carrier.

In additional chassis embodiments, the second hardware component is coupled to the first hardware component when the second hardware component is inserted between the arms of the carrier. In additional chassis embodiments, a guide of the carrier aligns the second hardware component with connectors of the first hardware component when the second hardware component is inserted between the arms of the carrier. In additional chassis embodiments, a guide of the first hardware component further aligns the second hardware component with connectors of the first hardware component when the second hardware component is inserted between the arms of the carrier. In additional chassis embodiments, the handles are not accessible to an administrator when in the concealed position. In additional chassis embodiments, each of the handles is rotated until within a cavity of a respective arm when in the concealed position. In additional chassis embodiments, each of the handles is spring-loaded by one or more springs when rotated within the respective arm cavity corresponding to the concealed position. In additional chassis embodiments, the handles are spring-loaded by the force applied by an administrator in inserting the second hardware component between the arms of the carrier. In additional chassis embodiments, the one or more springs unload upon an administrator extracting the second hardware component from between the arms of the carrier.

In various additional embodiments, carriers provided that are removeable from a first bay of a chassis housing one or more Information Handling Systems (IHSs). The carriers include: a bracket portion that is inserted in a distal end of the first bay, wherein a first hardware component is fastened to the bracket portion of the carrier, and wherein the first hardware component is coupled to one or more connectors of a midplane of the chassis when the first hardware component is fastened to the bracket portion and the carrier is installed in the first bay; and arms that extend from the bracket portion to the proximal end of the first bay when the bracket portion is inserted in the distal end of the first bay, wherein each arm comprises a retractable handle for use in extracting the carrier from the first bay when the retractable handles are in an extended position, wherein a second hardware components is inserted between the arms to insert the second hardware component in the proximal end of the first bay, and wherein the handles rotate to a concealed position when the second hardware component is inserted between the arms, and wherein the handles rotate to the extended position when the second hardware component is not inserted between the arms.

In additional carrier embodiments, the second hardware component is coupled to the first hardware component when the second hardware component is inserted between the arms of the carrier. In additional carrier embodiments, the carrier further comprises one or more guides that align the second hardware component with connectors of the first hardware component when the second hardware component is inserted between the arms of the carrier. In additional carrier embodiments, a guide of the first hardware component further aligns the second hardware component with connectors of the first hardware component when the second hardware component is inserted between the arms of the carrier. In additional carrier embodiments, each of the handles is rotated until within a cavity of a respective arm when in the concealed position. In additional carrier embodiments, each of the handles is spring loaded by one or more springs when rotated within the respective arm cavity of the concealed position. In additional carrier embodiments, the handles are spring loaded by the force applied by an administrator in inserting the second hardware component between the arms of the carrier. In additional carrier embodiments, the one or more springs unload upon an administrator extracting the second hardware component from between the arms of the carrier.

In various embodiments, Information Handling Systems (IHSs) include: a midplane comprising a plurality of connectors; a first bay of a chassis of the IHS for coupling hardware components to the IHS, wherein the first bay extends from the midplane at a distal end to a proximal end that is externally accessible; a removeable carrier inserted in the distal end of the first bay, wherein a first hardware component is fastened to the carrier and is coupled to one or more of the midplane connectors, and wherein the carrier comprises arms that extend to the proximal end of the first bay, and wherein each arm comprises a retractable handle for use in extracting the carrier from the first bay when the retractable handles are in an extended position; and a second, removeable hardware component inserted in the proximal end of the first bay, wherein the second hardware components is inserted between the arms of the carrier, and wherein the handles rotate to a concealed position when the second hardware component is inserted in between the arms of the carrier and wherein the handles rotate to the extended position when the second hardware component is not inserted in between the arms of the carrier.

In additional IHS embodiments, the handles are not accessible to an administrator when in the concealed position. In additional IHS embodiments, each of the handles is rotated until within a cavity of a respective arm when in the concealed position.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
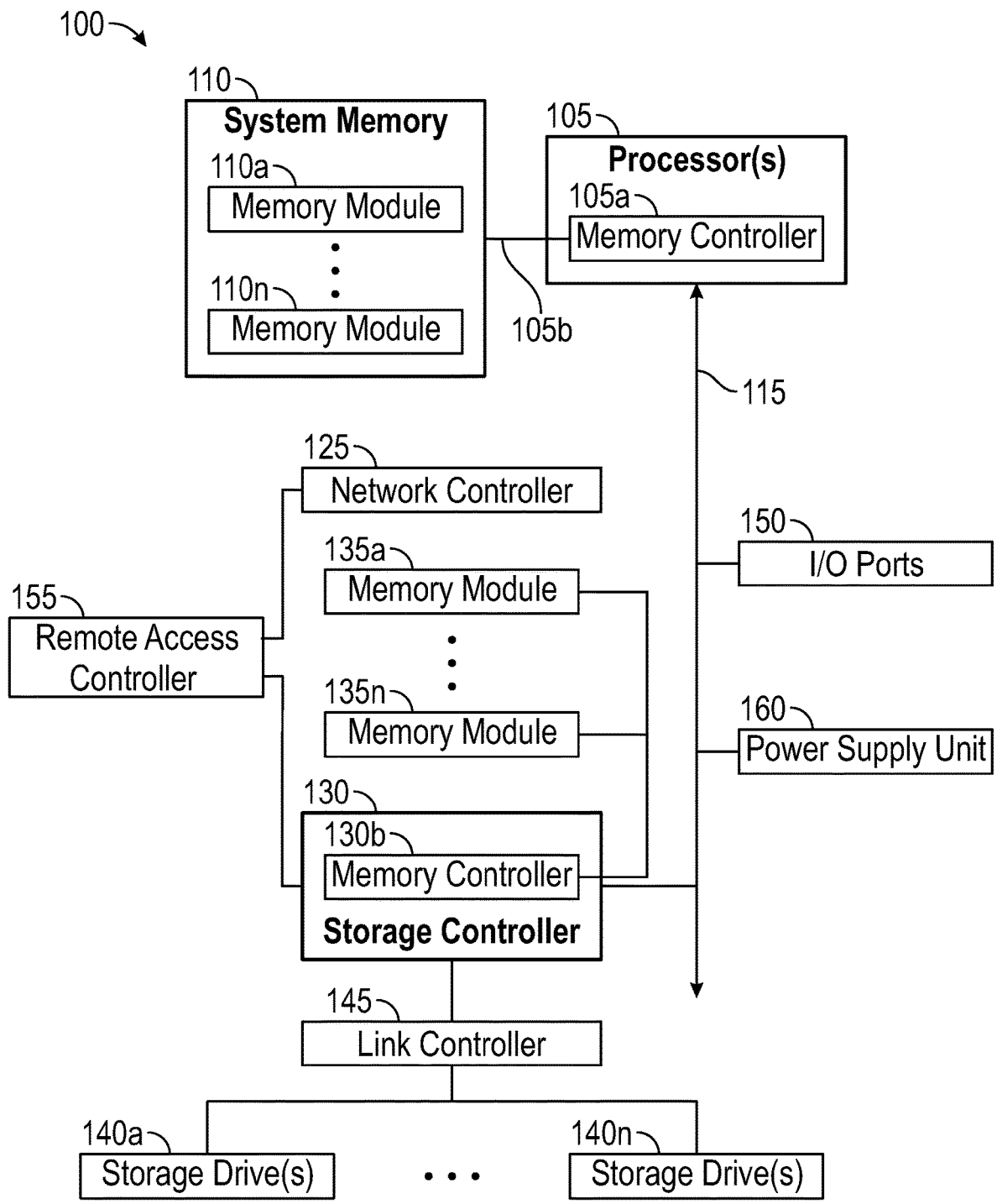
FIG. 1 is a diagram illustrating certain components of an IHS configured, according to embodiments, for utilizing a carrier that supports nested, replaceable hardware components.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. It should be appreciated that although certain IHSs described herein may be discussed in the context of enterprise computing servers, other embodiments may be utilized.

As described, in a data center environment, a server IHS may be installed within a chassis, in some cases along with other similar server IHSs. A rack may house multiple such chassis and a data center may house numerous racks. Each rack may host a large number of IHSs that are installed as components of a chassis with multiple chassis stacked and installed within a rack. In certain instances, the front-side of such rack-mounted chassis may include one or more bays that each receive an individual replaceable component, such as a storage drive or a computing node. Some rack-mounted chassis may be multiple rack units in height and may house multiple IHSs. For example, an IHS may be housed within a 2RU (2 Rack Units) chassis that houses two levels of 1RU components. In some cases, these components may be removeable components that may be inserted and extracted from rear-facing bays of the chassis. In some cases, these components may be hot-swappable components that may be removed and replaced by administrators while at least a portion of the IHS remains operational. In a data center environment, such hot-swappable components must support safe and efficient replacement of the components by administrators. Embodiments support safe and efficient replacement of nested components of an IHS that are both inserted in a single bay of a chassis, where the components may be replaced without using tools and with minimal opportunity for errors in removing the components from the bay in the wrong order.

FIG. 1 is a diagram illustrating certain components of an IHS 100 configured, according to embodiments, for utilizing a carrier that supports nested, replaceable hardware components, such as a storage controller 130 that is installed by nesting it within a carrier by which a link controller card 145 is coupled to IHS 100. Although the embodiments provided herein describe an IHS that is a rack-mounted server, other embodiments may be implemented using other types of IHSs. In the illustrative embodiment of FIG. 1, IHS 100 may be a server that would typically be installed within a chassis, that in turn would be typically installed within slots of a rack. Installed in this manner, IHS 100 may utilize certain shared resources provided by the chassis and/or rack, such as power and networking. In some embodiments, multiple servers such as IHS 100 may be installed within a single chassis.

IHS 100 may include one or more processors 105. In some embodiments, processors 205 may include a main processor and a co-processor, each of which may include a plurality of processing cores. As illustrated, processor(s) 105 may include an integrated memory controller 105a that may be implemented directly within the circuitry of the processor 105, or the memory controller 105a may be a separate integrated circuit that is located on the same die as the processor 105. The memory controller 105a may be configured to manage the transfer of data to and from the system memory 110 of the IHS 105 via a high-speed memory interface 105b.

System memory 110 may include memory components, such as such as static RAM (SRAM), dynamic RAM (DRAM), NAND Flash memory, suitable for supporting high-speed memory operations by the processor(s) 105. System memory 110 may combine both persistent, non-volatile memory and volatile memory. In certain embodiments, the system memory 110 may be comprised of multiple removable memory modules. The system memory 110 of the illustrated embodiment includes removable memory modules 110a-n. Each of the removable memory modules 110a-n may utilize a form factor corresponding to a motherboard expansion card socket that receives a type of removable memory module 110a-n, such as a DIMM (Dual In-line Memory Module). Other embodiments of IHS system memory 110 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 100 may operate using a chipset that may be implemented by integrated circuits that couple processor 105 to various other components of the motherboard of IHS 100. In some embodiments, all or portions of the chipset may be implemented directly within the integrated circuitry of an individual processor 105. The chipset may provide the processor(s) 105 with access to a variety of resources accessible via one or more buses 115. Various embodiments may utilize any number of buses to provide the illustrated pathways provided by the single illustrated bus 115. In certain embodiments, bus 115 may include a PCIe (PCI Express) switch fabric that is accessed via a root complex and coupled processor 105 to a variety of internal and external PCIe devices.

In various embodiments, a variety of resources may be coupled to the processor(s) 105 of the IHS 100 via buses 115 managed by the processor chipset. In some cases, these resources may be components of the motherboard of IHS 100 or these resources may be resources coupled to IHS 100, such as via I/O ports 150. In some embodiments, IHS 100 may include one or more I/O ports 150, such as PCIe ports, that may be used to couple the IHS 100 directly to other IHSs, storage resources or other peripheral components. In certain embodiments, the I/O ports 150 may provide couplings to a backplane or midplane of the chassis in which the IHS 100 is installed. In some instances, I/O ports 150 may include rear-facing externally accessible connectors by which external systems and networks may be coupled to IHS 100.

As illustrated, IHS 100 may also include a power supply unit 160 that provides the components of the chassis with appropriate levels of DC power. The power supply unit 160 may receive power inputs from an AC power source or from a shared power system that is provided by a rack within which IHS 100 may be installed. In certain embodiments, power supply unit 160 may be implemented as a swappable component that may be used to provide IHS 100 with redundant, hot-swappable power supply capabilities.

As illustrated, processor(s) 105 may also be coupled to a network controller 125, such as provided by a Network Interface Controller (NIC) that is coupled to the IHS 100 and allows the IHS 100 to communicate via an external network, such as the Internet or a LAN. Network controller 125 may include various microcontrollers, switches, adapters, and couplings used to connect IHS 100 to a network, where such connections may be established by IHS 100 directly or via shared networking components and connections provided by a rack in which chassis 100 is installed. In some embodiments, network controller 125 may allow IHS 100 to interface directly with network controllers from other nearby IHSs in support of clustered processing capabilities that utilize resources from multiple IHSs. In some embodiments, network controller 125 may be a swappable component that may be externally accessed and replaced while IHS 100 remains operational, for instance via a rear-facing bay of the IHS. In some embodiments, a network controller 125 may be coupled to IHS 100 by nesting the network controller 125 within a carrier by which another component has been coupled to IHS 100, in the same manner storage controller 130 may be nested within a carrier by which a link controller card 145 is coupled to IHS 100.

IHS 100 may include one or more storage controllers 130 that may be utilized to access storage drives 140a-n that are accessible via the chassis in which IHS 100 is installed, in some embodiments via a link controller 145. Storage controllers 130 may provide support for RAID (Redundant Array of Independent Disks) configurations of logical and physical storage drives 140a-n. In some embodiments, storage drives 140a-n may be replaceable, hot-swappable storage devices that are installed within bays provided by the chassis in which IHS 100 is installed. In some embodiments, storage drives 140a-n may also be accessed by other IHSs that are also installed within the same chassis as IHS 100. Although a single storage controller 130 is illustrated in FIG. 1, IHS 100 may include multiple storage controllers that may operate similarly to storage controller 130. In embodiments where storage drives 140a-n are hot-swappable devices that are received by front-facing bays of chassis, the storage drives 140a-n may be coupled to IHS 100 by couplings to a midplane 145 of IHS 100, where the couplings are supported via connectors of the front-facing bays of the chassis. In various embodiments, storage drives 140a-n may include SAS (Serial Attached SCSI) magnetic disk drives, SATA (Serial Advanced Technology Attachment) magnetic disk drives, solid-state drives (SSDs) and other types of storage drives in various combinations.

As with processor(s) 105, storage controller 130 may also include an integrated memory controller 130b that may be used to manage the transfer of data to and from one or more memory modules 135a-n via a high-speed memory interface. Through use of memory operations implemented by memory controller 130b and memory modules 135a-n, storage controller 130 may operate using cache memories in support of storage operations. Memory modules 135a-n may include memory components, such as such as static RAM (SRAM), dynamic RAM (DRAM), NAND Flash memory, suitable for supporting high-speed memory operations and may combine both persistent, non-volatile memory and volatile memory. As with the system memory 110, the memory modules 135a-n may utilize a form factor corresponding to a memory card socket, such as a DIMM (Dual In-line Memory Module).

In some embodiments, link controller 145 may operate as SAS (Serial Attached SCSI) expander that provides capabilities for accessing a large number of physical storage drives 140a-n. For instance, a link controller card 145 may be coupled to a midplane of IHS 100 and may provide access for up to 128 storage drives 140a-n that may be inserted within bays of the chassis in which IHS 100 is housed and thus coupled to the midplane. Since many storage controllers support connectors for a more limited number of storage drives, by coupling a storage controller 130 to a link controller card 145, the storage controller 130 may be provided access to all of the storage drives 140a-n that may be accessed by link controller 145.

In some embodiments, link controller 145 may be a card that is attached to a carrier, where the carrier is then inserted into a rear-facing bay of IHS 100. The carrier may be pushed forward into the bay until the link controller 145 that is fastened to the carrier is coupled to connectors of the midplane of IHS 100. As described in additional detail below, the carrier includes one or more arms that extend to the open end of the rear-facing bay, where each arm includes a retractable handle that may be used by an administrator to extract the carrier from the rear-facing bay. In some embodiments, once a carrier and the link controller that has been fastened to the carrier have been inserted into a bay of a chassis, a storage controller 130 may then be inserted within that same rear-facing bay of IHS 100, where the storage controller 130 is inserted between the two arms of the previously inserted carrier. In such embodiments, storage controller 130 may be pushed forward until it has been coupled to connectors of the link controller 145 and the storage controller 130 is nested within the space between the arms of the carrier, such that this space serves as an inner bay within the bay in which the carrier has been previously inserted.

As illustrated, IHS 100 includes a remote access controller (RAC) 155 that provides capabilities for remote monitoring and management of various aspects of the operation of IHS 100. In support of these monitoring and management functions, remote access controller 155 may utilize both in-band and sideband (i.e., out-of-band) communications with various internal components of IHS 100. Remote access controller 155 may additionally implement a variety of management capabilities. In some instances, remote access controller 155 operate from a different power plane from the processors 105, storage drives 140a-n and other components of IHS 100, thus allowing the remote access controller 155 to operate, and management tasks to proceed, while the processing cores of IHS 100 are powered off. Various BIOS functions, including launching the operating system of the IHS 100, may be implemented by the remote access controller 155. In some embodiments, the remote access controller 155 may perform various functions to verify the integrity of the IHS 100 and its hardware components prior to initialization of the IHS 100 (i.e., in a bare-metal state).

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 105 as a systems-on-a-chip.

Figure 2A:
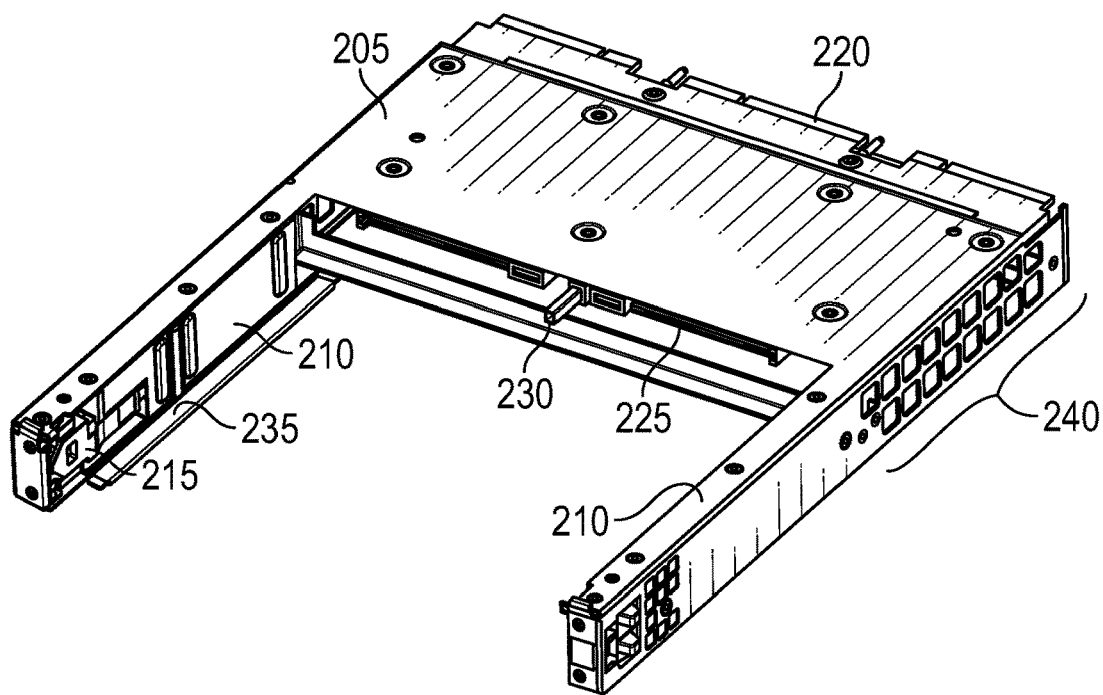
FIG. 2A is an illustration of a carrier, according to embodiments, that supports nested, replaceable hardware components.

FIG. 2A is an illustration of a carrier 205, according to embodiments, that supports nested, replaceable hardware components. As illustrated, carrier 205 includes a bracket portion 240 and two arms 210. As described in additional detail below, carrier 205 maybe inserted within a bay of a chassis. In some embodiments, a hardware component, such as the link control card of FIG. 1, may be fastened to the bracket portion. In the illustrated embodiment, front connectors 220 of a card, such as a link control card, that is fastened to the underside of the bracket portion 240 are visible. These front connectors 220 connect the card to connectors of the midplane of a chassis when the carrier 205 has been fully inserted into the bay of the chassis. Also visible in FIG. 2A are rear connectors 225 of the card that is fastened to the bracket portion 240 of the carrier 205. These rear connectors 225 support a coupling between the card fastened to the bracket portion 240 and a replaceable hardware component, such as a storage controller, that is nested between the arms 210 of the carrier 205.

As described with regard to FIG. 1, a storage controller may be coupled to a link control card in order to connect the storage controller to an array of storage drives that are supported by a chassis. In some embodiments, connectors of a storage controller device may be coupled to rear connectors 225 of a link control card by installing the storage controller between the arms 210 of the carrier 205 to which the link control card has been fastened. As described in further detail below, in this manner, a first replaceable hardware component, such as a storage controller, may be inserted in the same bay of a chassis is a second replaceable hardware component, such as a link control card, with the first component is nested between the arms of the carrier 205 to which the second component has been fastened.

As illustrated in FIG. 2A, the arms 210 of carrier 205 may include one or more rails 235 that extends from each arm and run along a length of each arm. In some embodiments, each arm may include a single lower rail, or may include both an upper and lower rail. When a component is inserted between the arms 210 of carrier 205, the rails 235 serves as a guide for vertically aligning the component with the rear connectors 225 of the component that is fastened to the bracket portion 240 of the carrier. As illustrated in additional detail below, an administrator nesting a component between the arms 210 of carrier 205 may rest the component on the bottom rails 235 and may then push the component forward until it is coupled to the rear connectors 225 of the card installed to the bracket portion 240 of the carrier. These rails 235 are also illustrated in the more detailed illustrations of the left arm 210a of carrier 205 in FIGS. 2B and 2C. As illustrated in FIG. 2A, the card installed to the bracket portion 240 of carrier 205 also includes a guidepost 230 that corresponds to a guide channel of the component that is nested between the arms 210 of carrier 205. When such a component is pushed forward along rails 235, the guidepost 230 is pushed into a guide channel of the component in order to further align connectors of the nested component with the rear connectors 225 of the card that has been fastened to the carrier 205.

Figure 2B:
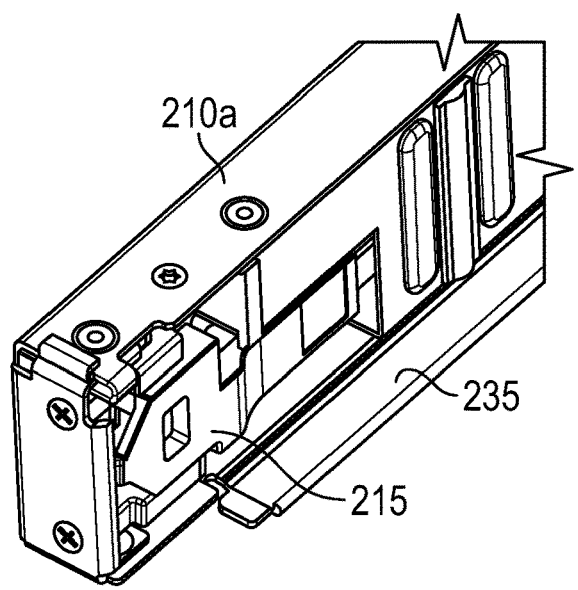
FIG. 2B is an illustration of a retractable handle of a carrier, according to embodiments, that supports nested, replaceable hardware components, where the handle is in a concealed position.
Figure 2C:
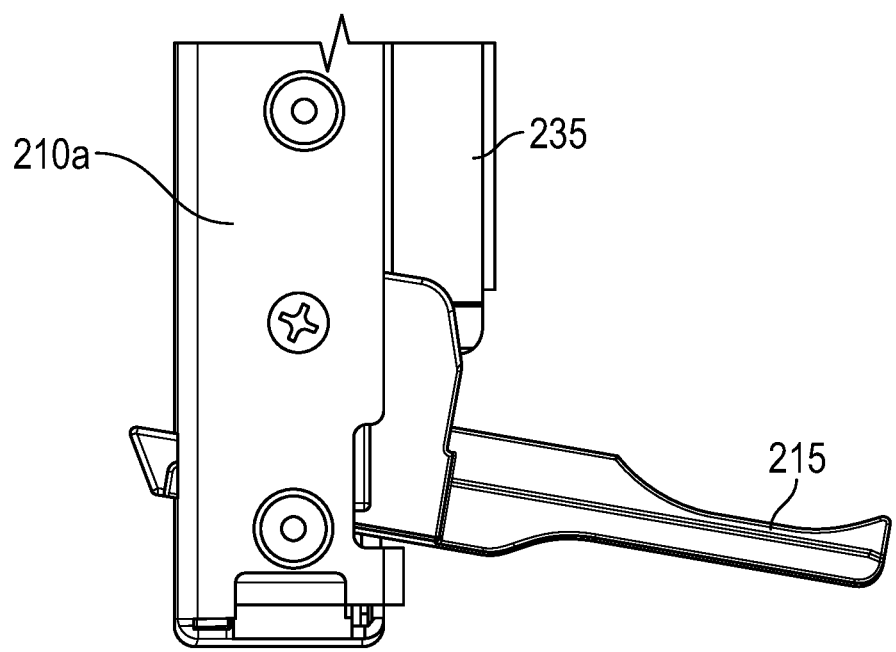
FIG. 2C is another illustration of a retractable handle of a carrier, according to embodiments, that supports nested, replaceable hardware components, where the handle is in an extended position.

FIG. 2B is an illustration of a portion of the retractable handle of the carrier 205 of FIG. 2A. More specifically, FIG. 2B depicts a more detailed view of the protruding end of the left arm 210a of the carrier 205 of FIG. 2A. As illustrated in both FIGS. 2A and 2B, a retractable handle 215 is recessed within a cavity of the left arm 210a of carrier 205. FIG. 2C is another illustration of the retractable handle 215 of the left arm 210a of carrier 205, where the handle 215 is in an extended position. As described in additional detail below, the retractable handle 215 may be rotated about a pivot into its recessed position within the cavity of arm 210a by the force applied by an administrator in pushing a component along rails 235 in order to nest the component between the arms 210 of the carrier 205. The force applied by the administrator may serve to load a spring connected to the handle 215 such that the handle 215 is spring-loaded while in the concealed position that is illustrated in FIG. 2B. When the administrator removes the component that is nested between the arms 210 of carrier 205, the springs connected to handle 215 are able to unload and the handles rotate about the pivot to the extended position illustrated in FIG. 2C.

Figure 3A:
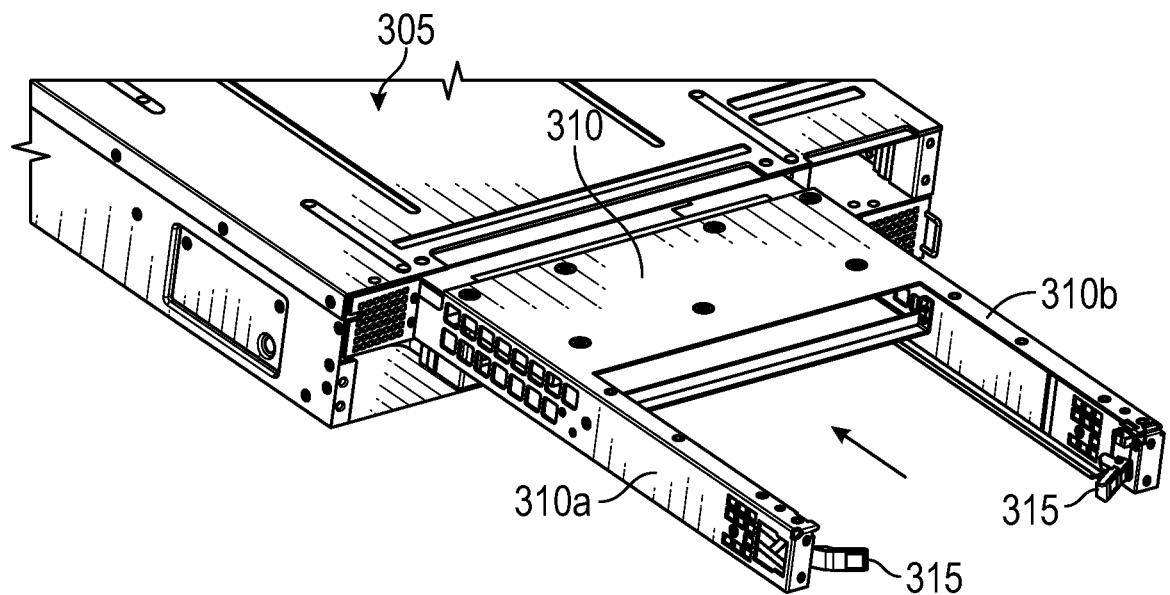
FIG. 3A is an illustration of the insertion of a carrier, according to embodiments, that supports nested, replaceable hardware components, where the carrier is being inserted in a rear-facing bay of a chassis.

FIG. 3A is an illustration of the insertion of a carrier 310, according to embodiments, that supports nested, replaceable hardware components, where the carrier is being inserted in a rear-facing bay of a chassis 305. As described, a component, such as a link control card, may be fastened to the bracket portion of carrier 310. An administrator may then insert the carrier 310 into a bay of chassis 305 and then push the carrier into this bay in the direction indicated in FIG. 3A. In some instances, the administrator may push the carrier 310 into the bay by pushing against the arms 310a-b that extend from the bracket portion of the carrier 310. Without any component installed between the arms 310a-b of carrier 310, the retractable handles 315 are in an extended position and protrude from each of the arms 310a-b.

Figure 3B:
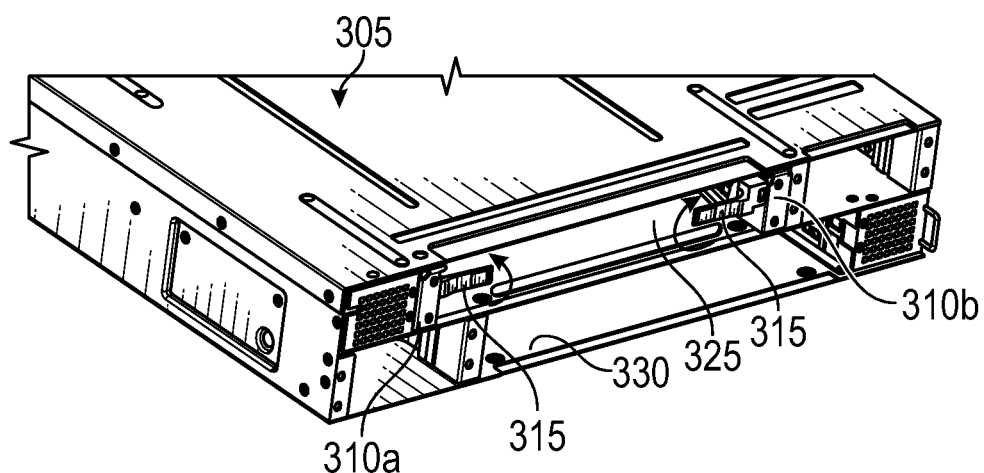
FIG. 3B is an illustration of an inserted carrier, according to embodiments, that supports nested, replaceable hardware components, where the carrier has been inserted in a rear-facing bay of a chassis.

FIG. 3B is an illustration of an inserted carrier, according to embodiments, that supports nested, replaceable hardware components, where the carrier has been inserted in a rear-facing bay of a chassis 305. In FIG. 3B, the carrier has been fully inserted within the top bay of chassis 305 such that each of the arms 310a-b of the carrier extend to the rear-facing opening of the bay. The chassis 305 is a 2RU chassis that supports the insertion of 1RU components in upper and lower rear-facing bays. In FIG. 3B, a 1RU carrier has been inserted in a top 1RU bay of chassis 305 and a lower 1RU bay 330 of the chassis is empty. In the installed configuration of FIG. 3B, the handles 315 of each of the arms 310a-b are in an extended position and an inner bay 325 between the arms 310a-b is empty.

Figure 3C:
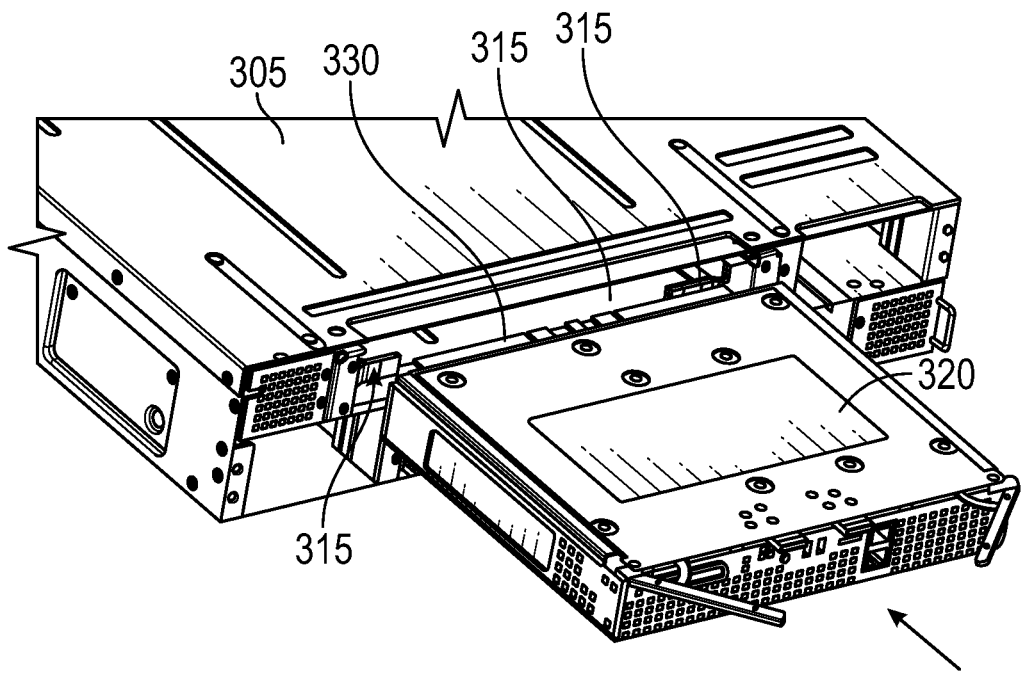
FIG. 3C is an illustration of the insertion of a nested hardware component within a carrier, according to embodiments, that supports nested, replaceable hardware components.

FIG. 3C is an illustration of the insertion of a nested hardware component 320 within a carrier, according to embodiments, that supports nested, replaceable hardware components. In FIG. 3C, an administrator is pushing a replaceable hardware component 320, such as a storage controller, in the indicated direction into the inner bay 325 between the arms 310a-b of the carrier that has been previously inserted into the top bay of carrier 305. As shown in FIG. 3C, the handles 315 of each arm remain in an extended position until the administrator pushes the component 320 into the inner bay 325. The replaceable hardware component 320 includes rear-facing connectors 330 that couple with connectors of the component that is fastened to the carrier. As described above, the rear face of component 320 may also include a guide channel or other such feature that serves to align rear-facing connectors 330 to the connectors of the component that fastened to the carrier.

Figure 3D:
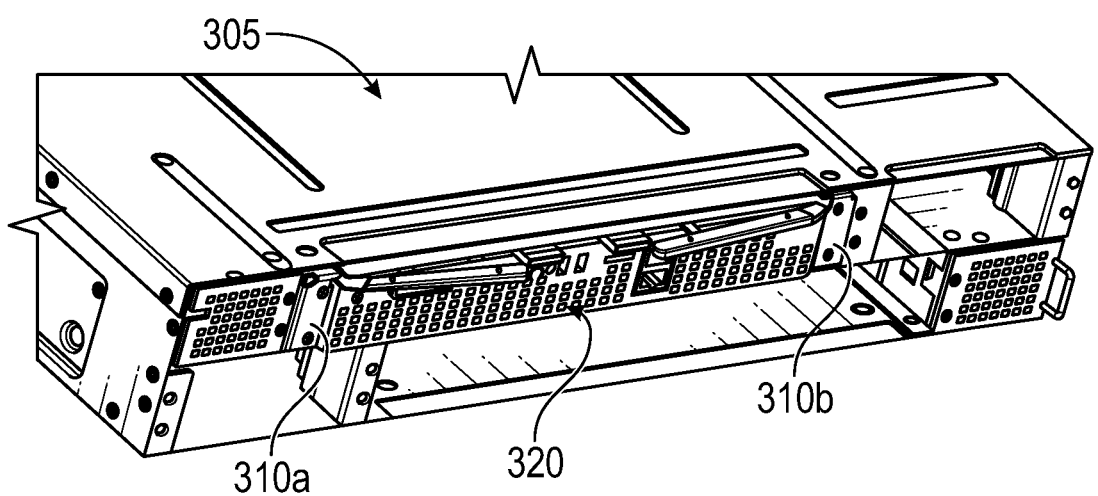
FIG. 3D is an illustration of a hardware component inserted within a carrier, according to embodiments, that supports nested, replaceable hardware components.

FIG. 3D is an illustration of a hardware component inserted within a carrier, according to embodiments, that supports nested, replaceable hardware components. In FIG. 3D, the hardware component 320 has been pushed into the inner bay between the arms 310a-b of the carrier and is flush with the visible portion of the arms 310a-b. The carrier and the component fastened to the carrier, such as a link controller card, may include guides that serve to align connectors of the inserted component 320, such as a storage controller, with connectors of the component fastened to the carrier. Accordingly, in the fully inserted configuration of FIG. 3D, the nested component 320 may be coupled to the component fastened to the carrier. As illustrated, the retractable handles are not accessible to an administrator when the nested component 320 has been inserted. As described above, the force applied in pushing the nested component 320 into the inner bay between arms 310a-b rotates the retractable handles until they are recessed within cavities of each of the arms 310a-b.

Figure 4A:
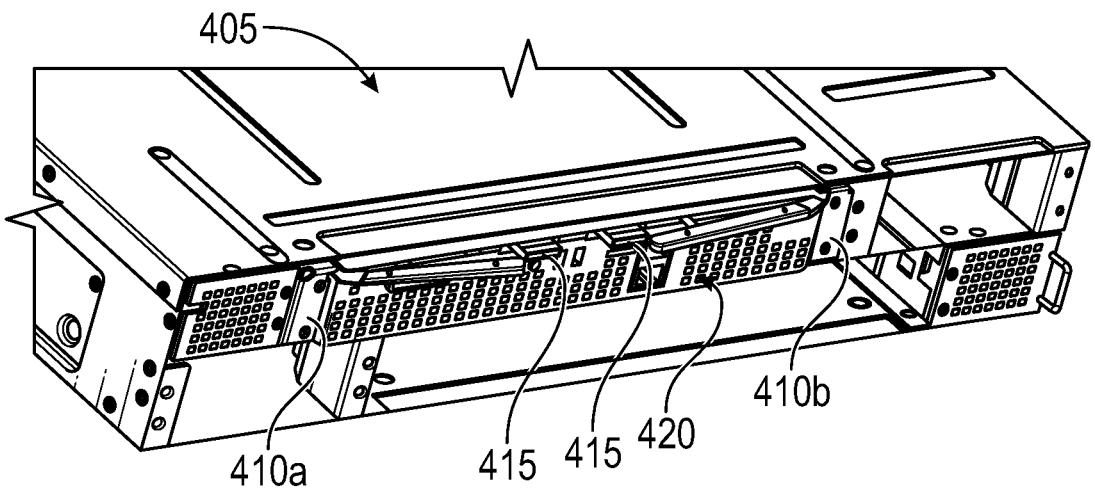
FIG. 4A is an illustration of a hardware component inserted within a carrier, according to embodiments, that supports nested, replaceable hardware components.

FIG. 4A is an illustration of a nested hardware component 420 inserted within a carrier, according to embodiments, that supports nested, replaceable hardware components. As in FIG. 3D, the nested component 420 is inserted in the inner bay between the arms 410a-b of the carrier that has been previously inserted in the upper rear-facing bay of chassis 405. In this configuration, an administrator may press buttons 415 on the rear face of component 420 in order to release handles for extracting the nested component 420 from the inner bay of the carrier. Importantly, the retractable handles used for extracting the carrier are not accessible and are concealed within cavities of the arms 410a-b. With the retractable handles of the carrier concealed in this manner, an administrator is prevented from accidentally releasing the carrier from its installed position prior to releasing and extracting nested component 420. Utilizing the described embodiments, an administrator is required to release and extract nested component 420 before even attempting to extract the carrier from the bay of chassis 405. This prevents damage that might result to the couplings between the nested component 420 in the component fastened to the carrier if the carrier and the nested component 420 were both pulled out of the bay while still connected. Additionally, inadvertent decoupling of the carrier when an administrator intends to decouple the nested component 420 may result in various unintended consequences, including unintended downtime.

Figure 4B:
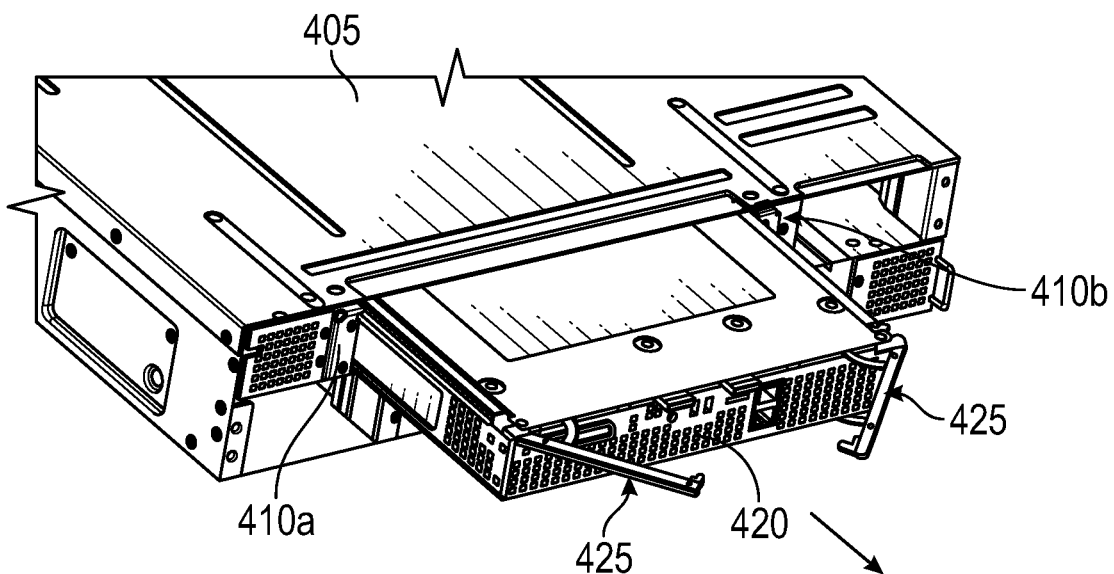
FIG. 4B is an illustration of the extraction of a hardware component from within a carrier, according to embodiments, that supports nested, replaceable hardware components.

FIG. 4B is an illustration of the extraction of a nested hardware component 420 from within a carrier, according to embodiments, that supports nested, replaceable hardware components. In FIG. 4B, and administrator has pressed buttons 415 of the nested component 420 such that handles 425 have been released and used to pull the nested component 420 in the indicated direction. The administrator may pull the nested component 420 to decouple it from the carrier, and the component fastened to the carrier, such that the carrier remains in place within the upper bay of the chassis 405. In some instances, the nested component 420 will be serviced or replaced and re-inserted into the inner bay of the carrier without removal of the carrier. In such instances, the component fastened to the carrier may remain operational while the nested component 420 is replaced.

Figure 4C:
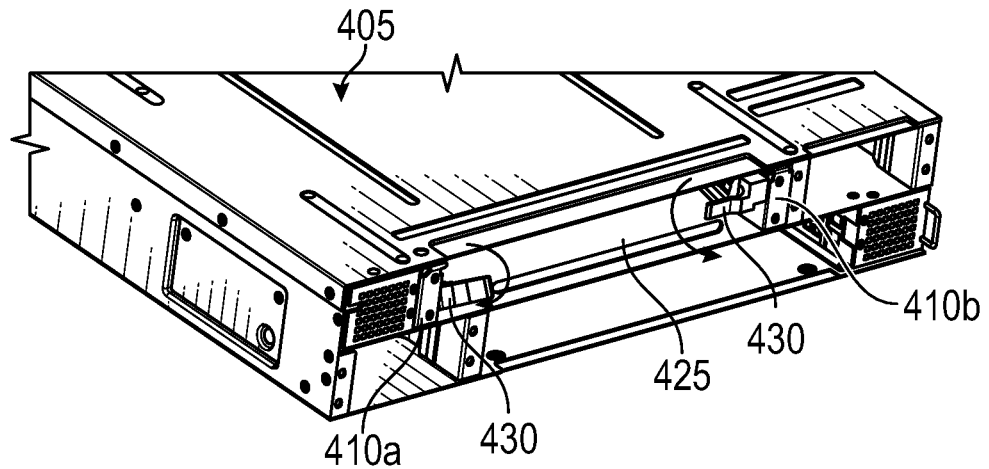
FIG. 4C is an illustration of carrier ready for extraction from a rear-facing bay of a chassis, according to embodiments, that supports nested, replaceable hardware components, where the retractable handles of the carrier are in an extended position.

FIG. 4C is an illustration of carrier ready for extraction from a rear-facing bay of a chassis 405, according to embodiments, that supports nested, replaceable hardware components, where the retractable handles of the carrier are in an extended position. With the nested component removed from the inner bay 425 between the arms 410*a-b* of the carrier, the retractable handles 430 are free to rotate to their extended position illustrated in FIG. 4C. As described, the retractable handles 430 may be recessed within cavities of arms 410*a-b* and may be spring-loaded when concealed in this manner. With the nested component removed, the springs of the retractable handles 430 are free to unload and the handles are rotated outward from the arm cavities in the indicated direction until the arms reach their extended position illustrated in FIG. 4C.

Figure 4D:
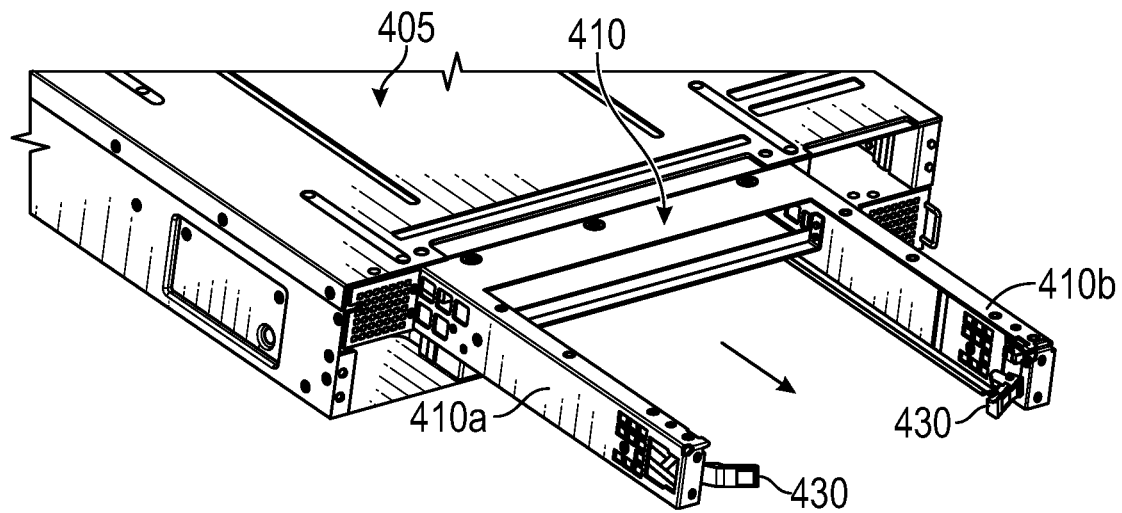
FIG. 4D is an illustration of the extraction of a carrier, according to embodiments, that supports nested, replaceable hardware components, where the carrier is being extracted from a rear-facing bay of a chassis.

FIG. 4D is an illustration of the extraction of a carrier 410, according to embodiments, that supports nested, replaceable hardware components, where the carrier is being extracted from a rear-facing bay of a chassis 405. In FIG. 4D, and administrator pulls the carrier 410 from the upper bay of chassis 405 by pulling on the handles 430 in the indicated direction. The force applied by the administrator serves to decouple the component fastened to the bracket portion of carrier 410 from its connections to the midplane of chassis 405. As described below, in their extended position illustrated in FIG. 4D, the handles 430 may be configured to reach a locking point that prevents rotation past a certain point when an administrator applies force on the handles 430 in order to pull the carrier 410 in the indicated direction. The administrator may safely hold the carrier 410 by its arms 410*a-b* in order to fully extract it from the upper bay of chassis 405. Upon removal, the administrator may service or replace the component that is fastened to the bracket portion of the carrier 410. Utilizing embodiments in this manner, an administrator is provided with the ability to remove both the nested component 420 and the carrier, to which another component is fastened, from the same bay of chassis without use of any tools.

Figure 5:
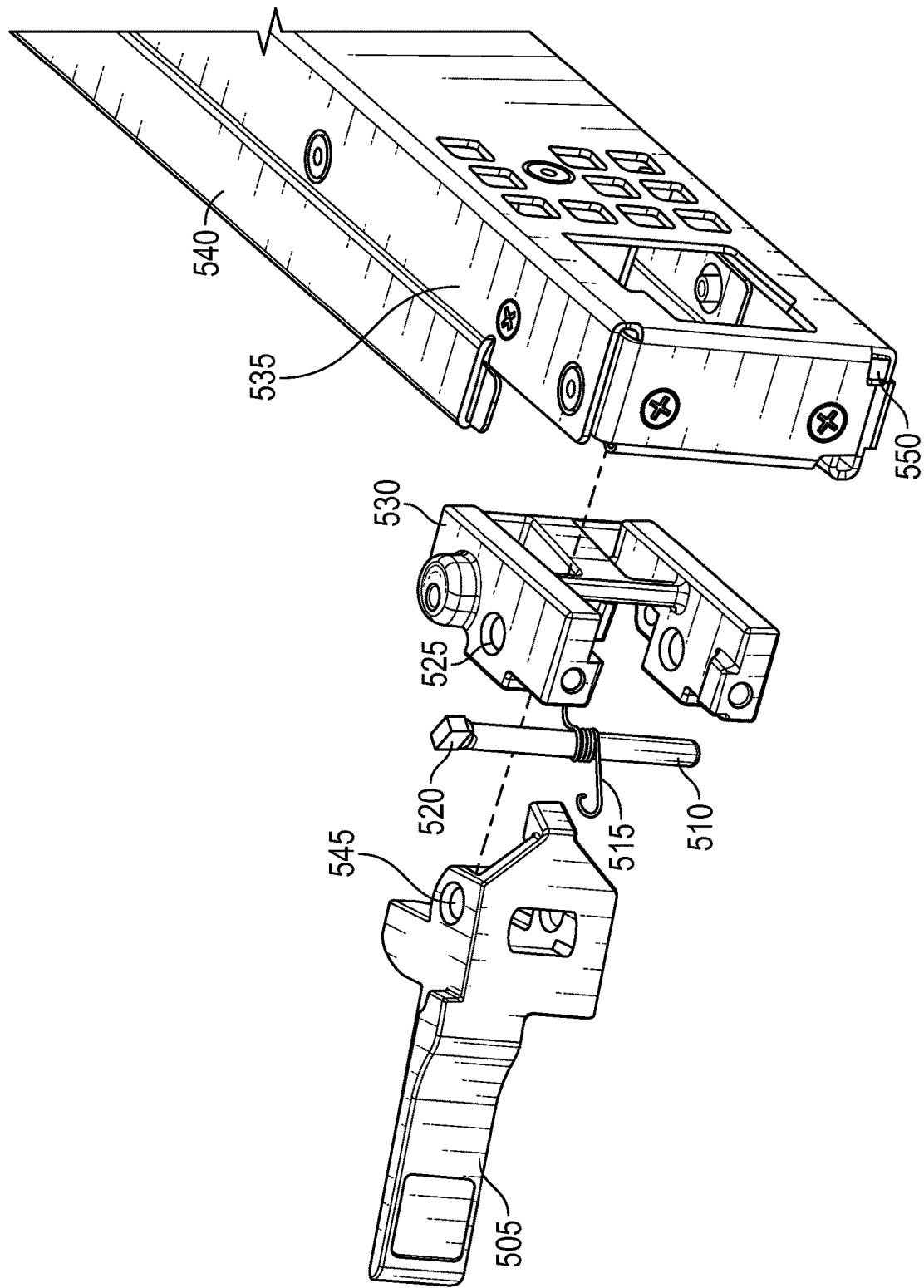
FIG. 5 is an illustration of the components of a retractable handle of a carrier, according to embodiments, that supports nested, replaceable hardware components.

FIG. 5 is an illustration of the components of a retractable handle of a carrier, according to embodiments, that supports nested, replaceable hardware components. FIG. 5 illustrates components used to implement a retractable handle 505 of the right arm 535 of a carrier, such as described above. As described, the arm 535 may include rails, such as top rail 540, that extend along the length of the arm 535 and serve to guide the nested component as it is inserted between the arms of carrier. When a component is nested between the arms of the carrier, the retractable handle 505 is rotated to a concealed position within a cavity of the arm 535. In the embodiment illustrated in FIG. 5, the retractable handle 505 rotates by pivoting about a pin 510 that couples the handle to an assembly 530 that is fastened within the cavity of the arm 535.

In the illustrated embodiment, retractable handle 505 is coupled to assembly 530 by aligning a hole 545 on a base portion of the handle 505 and a hole 525 of the assembly 530. Pin 510 may be inserted in these aligned holes 545 and 525 of the handle and assembly, where the pin 510 may include a protrusion 520 on one end that limits the travel of the pin 510 within the aligned holes. With the handle 505 coupled to the assembly 530 using pin 510, the assembly 530 may be fastened within the cavity of arm 535. As illustrated, a torsion spring 515 may be wound around a portion of pin 510 such that hooks on each end of spring 515 may be fixed to the handle 505 and to the assembly 530. In other embodiments, rather than utilizing hooks, each end of spring 515 may include rigid legs that correspond to structures in the base portion of handle 505 and of the assembly 530, where these structures hold the rigid legs of the spring firmly in place as it is loaded and unloaded. When a nested component is pushed into the inner bay between the arms of a carrier, the force applied by the component pushes the handle 505 such that it pivots about pin 510 until it reaches the concealed position of FIG. 2B. This pivoting of handle 505 about pin 510 serves to load spring 515.

When the administrator removes the nested component from between the arms of the carrier, the energy stored in the windings of spring 515 is released such that the spring unloads and the handle 505 rotates to its extended position, where it can be used to pull the carrier from inside the bay of a chassis. In some embodiments, the base portion of handle 505 may include a structure that meets a corresponding structure of assembly 530 when the handle has been rotated to its extended position, where these corresponding structures prevent outward rotation of the handle 505 past a certain angle. These structures thus serve as stops that allow an administrator to firmly pull on handle 505 such that the applied force is transferred from the handle 505 to the assembly 530, and thus to the arm 535 of the carrier. Embodiments thus support safe and efficient removal of the carrier from within a bay of the chassis.

In some embodiments, the rear-face of arm 435 may include a light pipe 550 that may extend along the length of the arm 435 and interface with a light source of the component that is fastened to the bracket portion of the carrier. This light pipe may be used to relay optical signals from the component fastened to the bracket portion of the carrier. For instance, a link controller card fastened to the bracket portion of the carrier may issued an optical signal via light guide 550 when a storage controller that has been nested within the arms of carrier has been successfully coupled to the link controller card. The link controller card may issue additional optical signals when the storage controller has been recognized and is operational. The link controller card may issue additional optical signals to notify an administrator of various error conditions. The light pipe 550 remains visible when the nested component has been installed such that the administrator may be provided with diagnostic information regarding both the nested component and the component fastened to the carrier, thus further easing the burden of administering these nested components.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A chassis housing one or more Information Handling Systems (IHSs), the chassis comprising:
   a midplane comprising a plurality of connectors;
   a first bay for coupling hardware components to the chassis, wherein the first bay extends from the midplane at a distal end to a proximal end that is externally accessible;
   a removeable carrier inserted in the distal end of the first bay, wherein a first hardware component is fastened to the carrier and interfaces with one or more of the midplane connectors, and wherein the carrier comprises arms that extend to the proximal end of the first bay, and wherein each arm comprises a retractable handle for use in extracting the removeable carrier from the first bay when the retractable handles are in an extended position; and
   a second, removeable hardware component inserted in the proximal end of the first bay, wherein the second hardware components is inserted between the arms of the carrier, and wherein the handles rotate to a concealed position when the second hardware component is inserted in between the arms of the carrier and wherein the handles rotate to the extended position when the second hardware component is removed.

2. The chassis of claim 1, wherein the second hardware component is coupled to the first hardware component when the second hardware component is inserted between the arms of the carrier.

3. The chassis of claim 2, wherein a guide of the carrier aligns the second hardware component with connectors of the first hardware component when the second hardware component is inserted between the arms of the carrier.

4. The chassis of claim 3, wherein a guide of the first hardware component further aligns the second hardware component with connectors of the first hardware component when the second hardware component is inserted between the arms of the carrier.

5. The chassis of claim 1, wherein the handles are not accessible to an administrator when in the concealed position.

6. The chassis of claim 1, wherein each of the handles is rotated until within a cavity of a respective arm when in the concealed position.

7. The chassis of claim 6, wherein each of the handles is spring-loaded by one or more springs when rotated within the respective arm cavity corresponding to the concealed position.

8. The chassis of claim 7, wherein the handles are spring-loaded by the force applied by an administrator in inserting the second hardware component between the arms of the carrier.

9. The chassis of claim 7, wherein the one or more springs unload upon an administrator extracting the second hardware component from between the arms of the carrier.

10. A carrier that is removeable from a first bay of a chassis housing one or more Information Handling Systems (IHSs), the carrier comprising:
    a bracket portion that is inserted in a distal end of the first bay, wherein a first hardware component is fastened to the bracket portion of the carrier, and wherein the first hardware component is coupled to one or more connectors of a midplane of the chassis when the first hardware component is fastened to the bracket portion and the carrier is installed in the first bay; and
    arms that extend from the bracket portion to the proximal end of the first bay when the bracket portion is inserted in the distal end of the first bay, wherein each arm comprises a retractable handle for use in extracting the carrier from the first bay when the retractable handles are in an extended position, wherein a second hardware components is inserted between the arms to insert the second hardware component in the proximal end of the first bay, and wherein the handles rotate to a concealed position when the second hardware component is inserted between the arms, and wherein the handles rotate to the extended position when the second hardware component is removed.

11. The carrier of claim 10, wherein the second hardware component is coupled to the first hardware component when the second hardware component is inserted between the arms of the carrier.

12. The carrier of claim 11, wherein the carrier further comprises one or more guides that align the second hardware component with connectors of the first hardware component when the second hardware component is inserted between the arms of the carrier.

13. The carrier of claim 12, wherein a guide of the first hardware component further aligns the second hardware component with connectors of the first hardware component when the second hardware component is inserted between the arms of the carrier.

14. The carrier of claim 10, wherein each of the handles is rotated until within a cavity of a respective arm when in the concealed position.

15. The carrier of claim 14, wherein each of the handles is spring loaded by one or more springs when rotated within the respective arm cavity of the concealed position.

16. The carrier of claim 15, wherein the handles are spring loaded by the force applied by an administrator in inserting the second hardware component between the arms of the carrier.

17. The carrier of claim 15, wherein the one or more springs unload upon an administrator extracting the second hardware component from between the arms of the carrier.

18. An Information Handling System (IHS) comprising:
a midplane comprising a plurality of connectors;
a first bay of a chassis of the IHS for coupling hardware components to the IHS, wherein the first bay extends from the midplane at a distal end to a proximal end that is externally accessible;
a removeable carrier inserted in the distal end of the first bay, wherein a first hardware component is fastened to the carrier and is coupled to one or more of the midplane connectors, and wherein the carrier comprises arms that extend to the proximal end of the first bay, and wherein each arm comprises a retractable handle for use in extracting the carrier from the first bay when the retractable handles are in an extended position; and
a second, removeable hardware component inserted in the proximal end of the first bay, wherein the second hardware components is inserted between the arms of the carrier, and wherein the handles rotate to a concealed position when the second hardware component is inserted in between the arms of the carrier and wherein the handles rotate to the extended position when the second hardware component is removed.

19. The IHS of claim 18, wherein the handles are not accessible to an administrator when in the concealed position.

20. The IHS of claim 18, wherein each of the handles is rotated until within a cavity of a respective arm when in the concealed position.

* * * * *